United States Patent
Mou et al.

(10) Patent No.: US 11,889,766 B2
(45) Date of Patent: Jan. 30, 2024

(54) MINIATURE FLUID ACTUATOR

(71) Applicant: Microjet Technology Co., Ltd., Hsinchu (TW)

(72) Inventors: Hao-Jan Mou, Hsinchu (TW); Hsien-Chung Tai, Hsinchu (TW); Lin-Huei Fang, Hsinchu (TW); Yung-Lung Han, Hsinchu (TW); Chi-Feng Huang, Hsinchu (TW); Chun-Yi Kuo, Hsinchu (TW); Tsung-I Lin, Hsinchu (TW)

(73) Assignee: Microjet Technology Co., Ltd., Hsinchu (TW)

( * ) Notice: Subject to any disclaimer, the term of this patent is extended or adjusted under 35 U.S.C. 154(b) by 679 days.

(21) Appl. No.: 17/072,642

(22) Filed: Oct. 16, 2020

(65) Prior Publication Data
US 2021/0151663 A1 May 20, 2021

(30) Foreign Application Priority Data
Nov. 18, 2019 (TW) .................................. 108141845

(51) Int. Cl.
*H01L 41/09* (2006.01)
*H10N 30/20* (2023.01)

(52) U.S. Cl.
CPC .............................. *H10N 30/2047* (2023.02)

(58) Field of Classification Search
CPC .................................................. H10N 30/2047
USPC ....................................................... 310/330
See application file for complete search history.

(56) References Cited

U.S. PATENT DOCUMENTS

| 7,416,281 B2* | 8/2008 | Nishimura | B41J 2/1628 |
| | | | 359/290 |
| 2019/0063417 A1 | 2/2019 | Mou et al. | |
| 2020/0053905 A1* | 2/2020 | Ganti | H05K 7/20 |

FOREIGN PATENT DOCUMENTS

| CN | 206439166 U | 8/2017 |
| CN | 108071577 A | 5/2018 |
| CN | 208203524 U | 12/2018 |
| TW | 201817971 A | 5/2018 |
| TW | M575806 U | 3/2019 |

* cited by examiner

*Primary Examiner* — Shawki S Ismail
*Assistant Examiner* — Monica Mata
(74) *Attorney, Agent, or Firm* — Birch, Stewart, Kolasch & Birch, LLP (57) ABSTRACT

A miniature fluid actuator is disclosed and includes a substrate, a chamber layer, a carrying layer and a piezoelectric assembly. The substrate has an inlet. The chamber layer is formed on the substrate and includes a first chamber in communication with the inlet, a resonance layer and a second chamber. The resonance layer has a central aperture in communication between the first chamber and the second chamber. The carrying layer includes a fixed region formed on the chamber layer, a vibration region, a connection portion and a vacant. The vibration region is located at a center of the fixed region and corresponding to the second chamber. The connection portion is connected between the fixed region and the vibration region. The vacant is formed among the fixed region, the vibration region and the connection portion. The piezoelectric assembly is formed on the vibration region.

12 Claims, 7 Drawing Sheets

MINIATURE FLUID ACTUATOR

FIELD OF THE INVENTION

The present disclosure relates to a miniature fluid actuator, and more particularly to a miniature fluid actuator produced by utilizing a semiconductor process.

BACKGROUND OF THE INVENTION

Currently, in all fields, the products used in many sectors such as pharmaceutical industries, computer techniques, printing industries or energy industries are developed toward elaboration and miniaturization. The fluid transportation devices are important components that are used in for example micro pumps, micro atomizers, printheads or the industrial printers.

With the rapid advancement of science and technology, the application of fluid transportation device tends to be more and more diversified. For the industrial applications, the biomedical applications, the healthcare, the electronic cooling and so on, even the most popular wearable devices, the fluid transportation device is utilized therein. It is obviously that the conventional fluid transportation devices gradually tend to miniaturize the structure and maximize the flow rate thereof.

Most of the conventional miniature fluid actuators are formed by sequentially stacking and combining a plurality of chips, which are produced through etching processes. However, the size of the conventional miniature fluid actuator is very small. It is difficult to combining the chips of conventional the miniature fluid actuator. Moreover, when the chips of the conventional miniature fluid actuator are combined, the position of fluid-flowing chamber may be misaligned or the depth error of the fluid-flowing chamber may be generated. It causes the conventional miniature fluid actuator to greatly reduce the efficiency thereof and even be classified as defective products. Therefore, how to produce a miniature fluid actuator into one piece integrally is an important subject developed in the present disclosure.

SUMMARY OF THE DISCLOSURE

An object of the present disclosure is to provide a miniature fluid actuator. It is produced by a semiconductor process supplemented with a one-poly-six-metal (1P6M) process or a two-poly-four-metal (2P4M) process.

In accordance with an aspect of the present disclosure, there is provided a miniature fluid actuator. The miniature fluid actuator includes a substrate, a chamber layer, a carrying layer and a piezoelectric assembly. The substrate has at least one inlet. The chamber layer is formed on the substrate and includes a first chamber, a resonance layer and a second chamber. The first chamber is connected to the at least one inlet. The resonance layer has a central aperture. The central aperture is in communication with the first chamber. The second chamber spatially corresponds to the first chamber and is in communication with the first chamber through the central aperture. The carrying layer is formed on the chamber layer and includes a fixed region, a vibration region, at least one connection portion and at least one vacant. The fixed region is formed on the chamber layer. The vibration region is located at a center of the fixed region and spatially corresponds to the second chamber. The at least one connection portion is connected between the fixed region and the vibration region. The at least one vacant is formed among the fixed region, the vibration region and the at least one connection portion. The piezoelectric assembly is formed on the vibration region.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
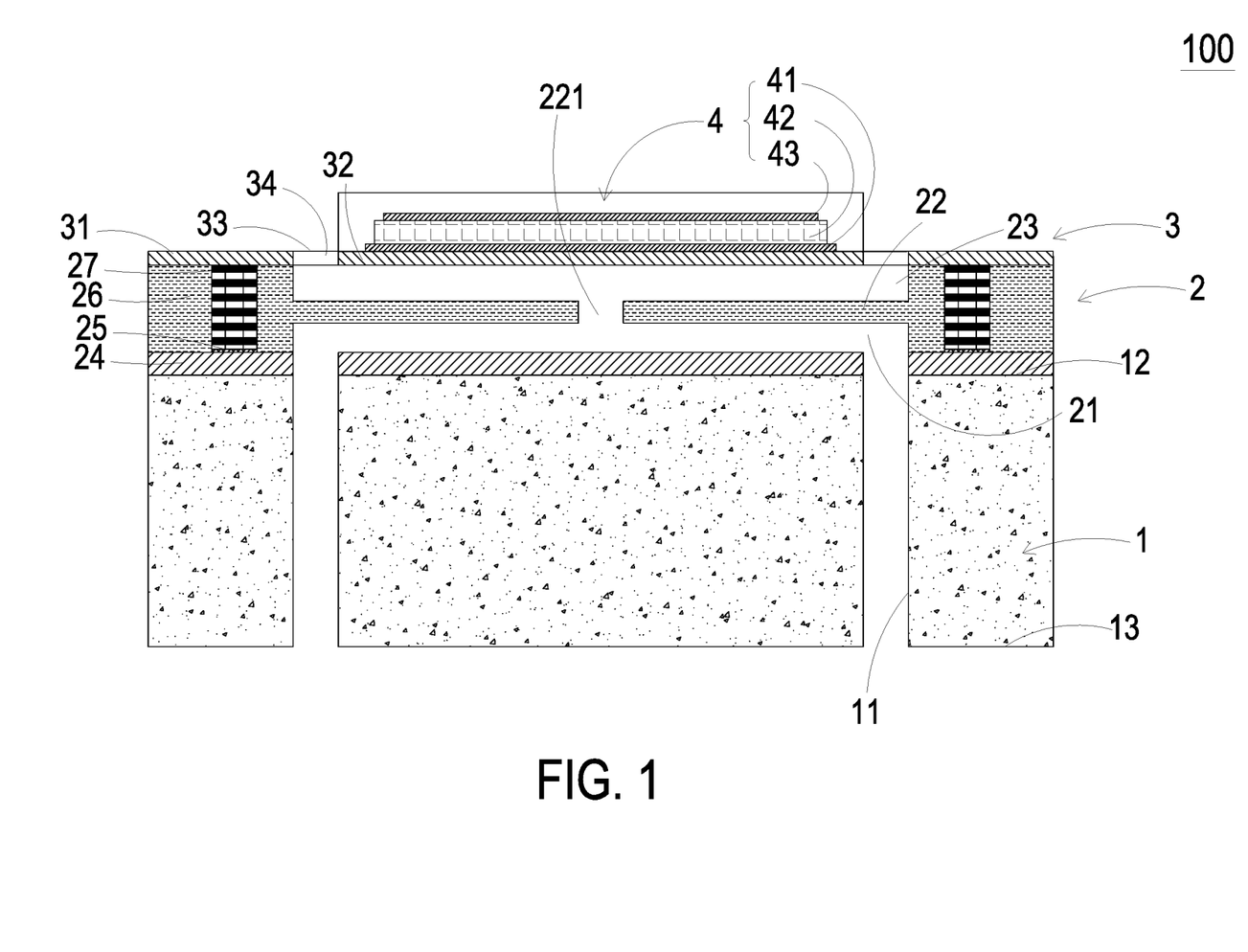
FIG. 1 is a cross sectional view illustrating a miniature fluid actuator according to a first embodiment of the present disclosure.

Please refer to FIG. 1, the present disclosure provides a miniature fluid actuator 100. The micro fluid actuator 100 includes a substrate 1, a chamber layer 2, a carrying layer 3 and a piezoelectric assembly 4. The chamber layer 2 is formed on the substrate 1. The carrying layer 3 is formed on the chamber layer 2. The piezoelectric assembly 4 is formed on the carrying layer 3.

In the embodiment, the substrate 1 has at least one inlet 11, a first surface 12 and a second surface 13. The first surface 12 and the second surface 13 are two opposite surfaces. The at least one inlet 11 penetrates through the first surface 12 and the second surface 13.

In the embodiment, the chamber layer 2 is formed on the first surface 12 of the substrate 1, and includes a first chamber 21, a resonance layer 22 and a second chamber 23. The first chamber 21 is disposed adjacent to the first surface 12 of the substrate 1, and is in communication with the at least one inlet 11 of the substrate 1. The resonance layer 22 is disposed between the first chamber 21 and the second chamber 23, and has a central aperture 221. The central aperture 221 is in communication with the first chamber 21. The second chamber 23 spatially corresponds to the first chamber 21 and is in communication with the first chamber 21 through the central aperture 221 of the resonance layer 22.

In the embodiment, the carrying layer 3 includes a fixed region 31, a vibration region 32, at least one connection portion 33 and at least one vacant 34. The carrying layer 3 is fixed on the chamber layer 2 through the fixed region 31.

The vibration region 32 is located at a center of the fixed region 31 and spatially corresponds to the second chamber 23. The at least one connection portion 33 is connected between the fixed region 31 and the vibration region 32. The at least one vacant 34 is formed among the fixed region 31, the vibration region 32 and the at least one connection portion 33, to allow fluid to flow therethrough.

In the embodiment, the piezoelectric assembly 4 includes a lower electrode layer 41, a piezoelectric actuation layer 42 and an upper electrode layer 43. The lower electrode layer 41 is formed on the surface of the vibration region 32. The piezoelectric actuation layer 42 is stacked on the lower electrode layer 41. The upper electrode layer 43 is stacked on the piezoelectric actuation layer 42 and electrically connected with the piezoelectric actuation layer 42.

In the embodiment, the volume of the first chamber 21 and the volume of the second chamber 23 of the chamber layer 2 of the miniature fluid actuator 100 are directly affect the transportation efficiency of the miniature fluid actuator 100. Therefore, in order to accurately define the volumes of the first chamber 21 and the second chamber 23, the miniature fluid actuator 100 of the present disclosure is produced by a general semiconductor manufacturing process supplemented with other structures and processes. Please refer to FIG. 1. In the embodiment, the chamber layer 2 includes an insulation layer 24, a polysilicon layer 25, a protective layer 26 and a plurality of metal layers 27. The insulation layer 24 is formed on the first surface 12 of the substrate 1. Preferably but not exclusively, the insulation layer 24 is a silicon dioxide (SiO$_2$) layer. The present disclosure is not limited thereto. The polysilicon layer 25 is formed on the insulation layer 24. The protective layer 26 and the plurality of metal layers 27 are formed on the polysilicon layer 25. Preferably but not exclusively, the supplemented process is a one-poly-six-metal (1P6M) process of the complementary metal-oxide-semiconductor (CMOS) and the micro-electro-mechanical system (MSMS) process.

In the embodiment, the plurality of metal layers 27 are formed by deposition at a preset position for the first chamber 21 and the second chamber 23, so as to ensure the positions and the sizes of the first chamber 21 and the second chamber 23. The protective layer 26 is utilized to form the structure of the other region. Thereafter, the plurality of metal layers 27 located in the first chamber 21 and the second chamber 23 are removed through an etching process, so that the positions and sizes of the first chamber 21 and the second chamber 23 are accurately defined, and the error caused due to the manufacturing process for the first chamber 21 and the second chamber 23 is avoided.

Please refer to FIG. 1. In the embodiment, the first chamber 21 and the second chamber 23 are accurately formed in the chamber layer 2 through the 1P6M process. Preferably but not exclusively, the resonance layer 22 is formed by the protective layer 26.

Figure 2:
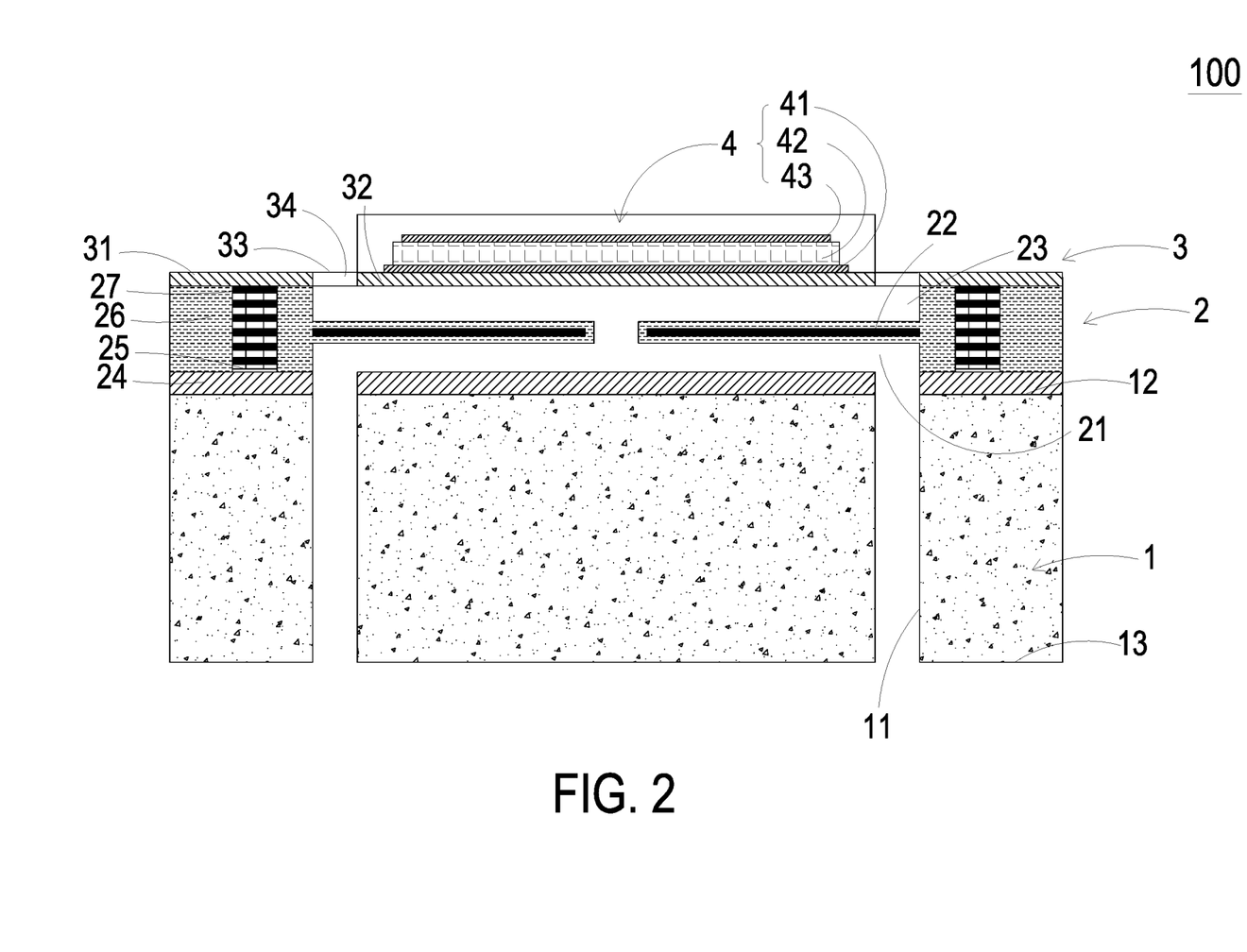
FIG. 2 is a cross sectional view illustrating a miniature fluid actuator according to a second embodiment of the present disclosure.

Please refer to FIG. 2. It illustrates a miniature fluid actuator 100 according to a second embodiment of the present disclosure. Similarly, in the embodiment, the first chamber 21 and the second chamber 23 are accurately formed in the chamber layer 2 through the 1P6M process. Different from the miniature fluid actuator 100 of FIG. 1, the resonance layer 22 in the second embodiment is formed by one of the plurality of metal layers 27 surrounded by the protective layer 26.

Figure 3:
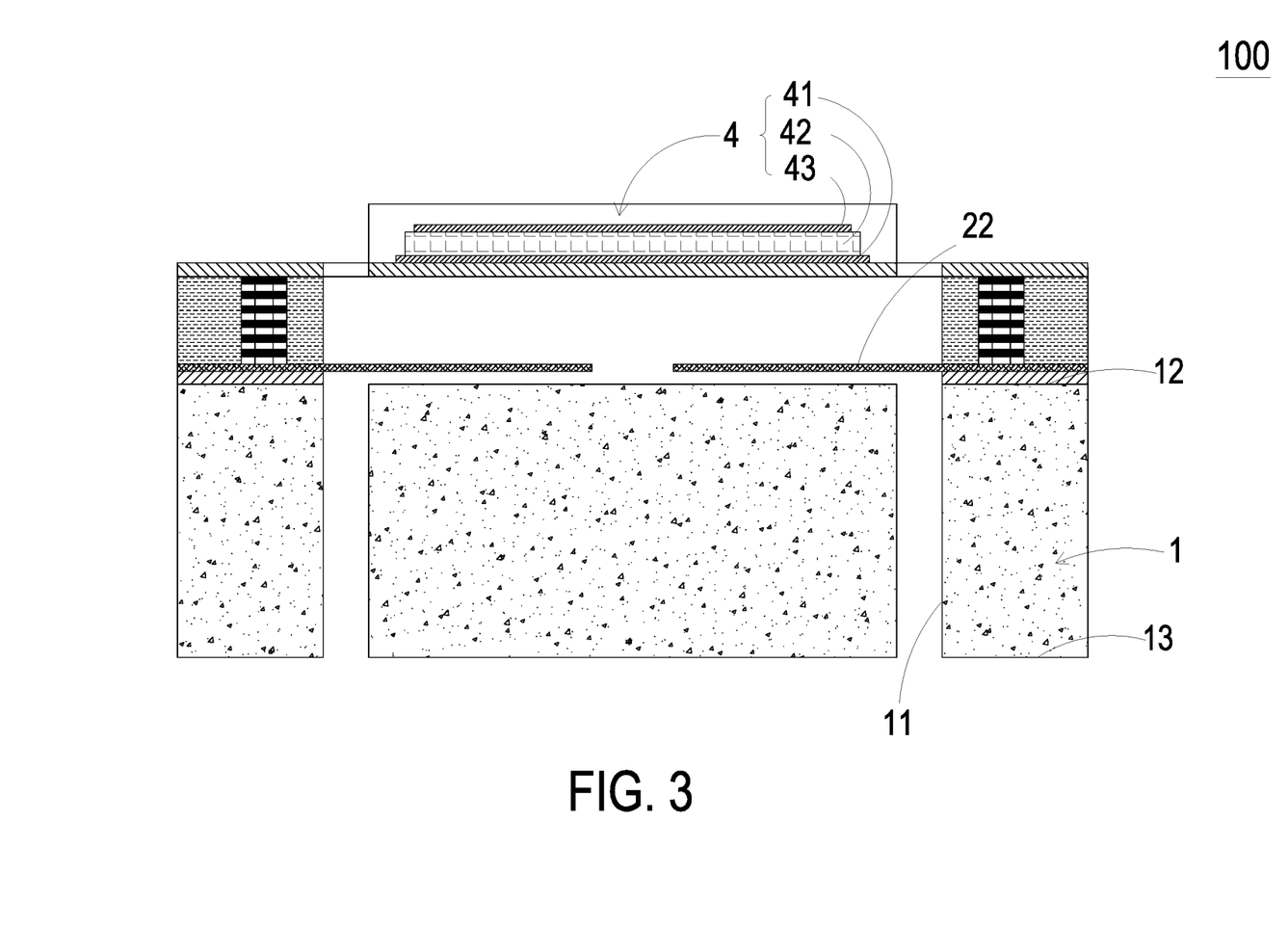
FIG. 3 is a cross sectional view illustrating a miniature fluid actuator according to a third embodiment of the present disclosure.

Please refer to FIG. 3. It illustrates a miniature fluid actuator 100 according to a third embodiment of the present disclosure. Similarly, in the embodiment, the first chamber 21 and the second chamber 23 are accurately formed in the chamber layer 2 through the 1P6M process. Preferably but not exclusively, the resonance layer 22 in the third embodiment is formed by the polysilicon layer 25.

Figure 4:
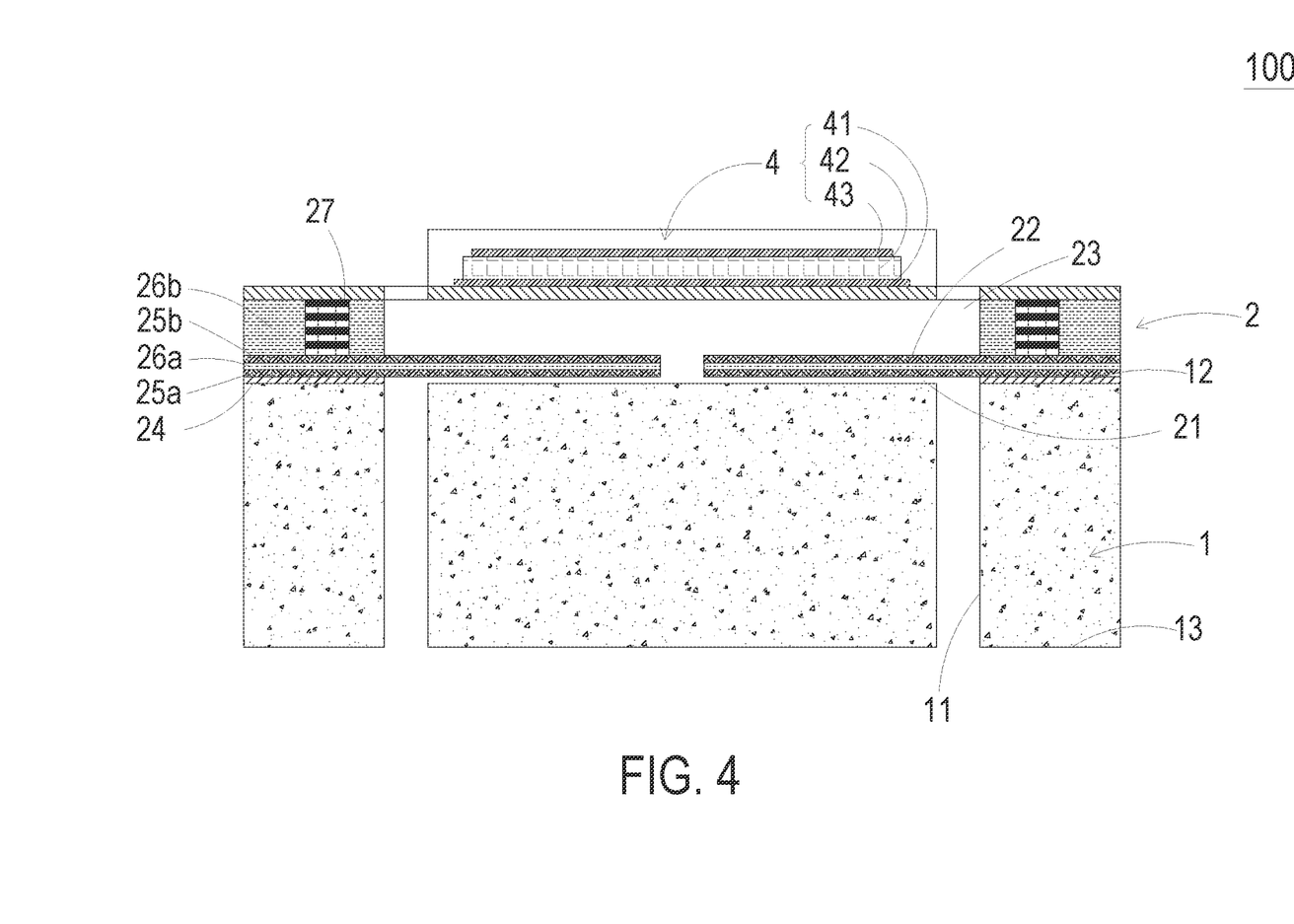
FIG. 4 is a cross sectional view illustrating a miniature fluid actuator according to a fourth embodiment of the present disclosure.

Please refer to FIG. 4. It illustrates a miniature fluid actuator 100 according to a fourth embodiment of the present disclosure. In the embodiment, the first chamber 21 and the second chamber 23 are accurately formed in the chamber layer 2 through the 2P4M process. In the embodiment, the chamber layer 2 includes an insulation layer 24, a first polysilicon layer 25a, a first protective layer 26a, a second polysilicon layer 25b, a second protective layer 26b and a plurality of metal layers 27. The insulation layer 24 is formed on the substrate 1. The first polysilicon layer 25a is formed on the insulation layer 24. The first protective layer 26a is formed on the first polysilicon layer 25a. The second polysilicon layer 25b is formed on the first protective layer 26a. The second protective layer 26b and the plurality of metal layers 27 are formed on the second polysilicon layer 25b. Preferably but not exclusively, the resonance layer 22 in the fourth embodiment is formed by the first polysilicon layer 25a, the first protective layer 26a and the second polysilicon layer 25b.

Preferably but not exclusively, the above-mentioned insulation layer 24 is a silicon dioxide layer. The protective layer 26, the first protective layer 26a and the second protective layer 26b can be but not limited to an oxide layer. Preferably but not exclusively, the carrier layer 3 is a silicon dioxide layer or a silicon nitride layer. The present disclosure is not limited thereto.

Figure 5:
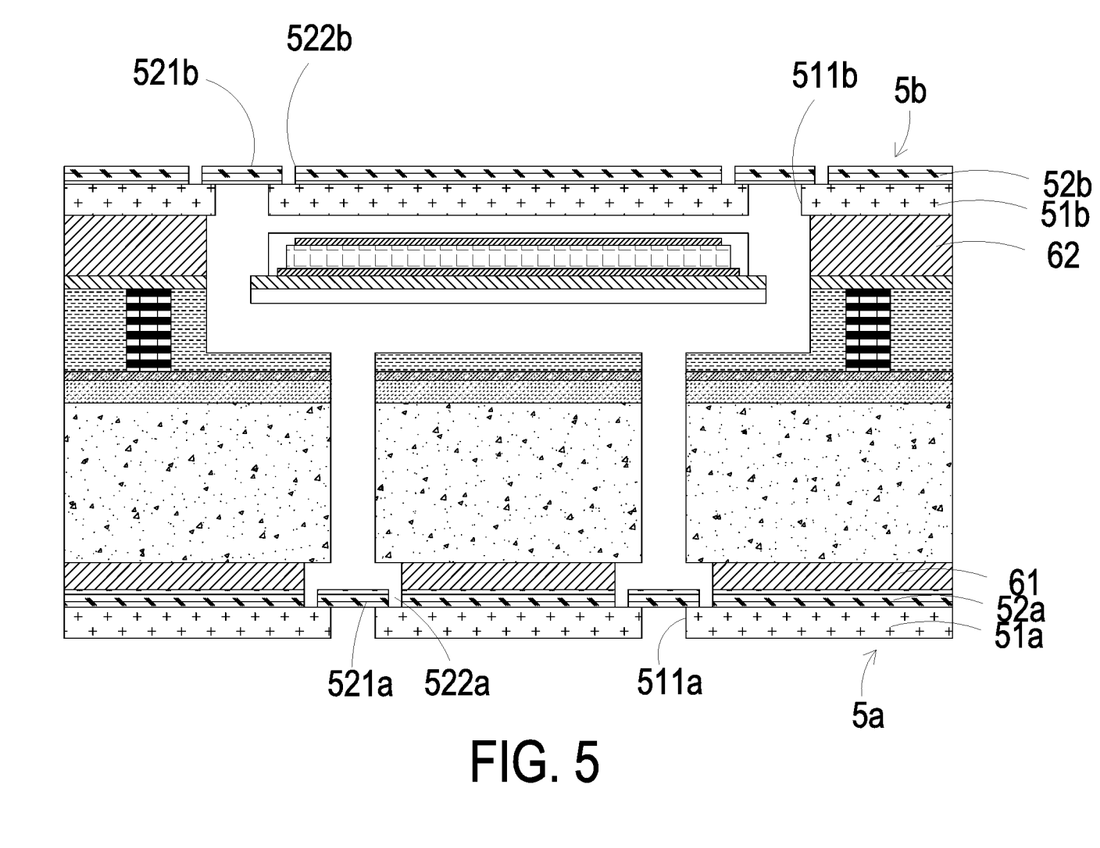
FIG. 5 is a cross sectional view illustrating a miniature fluid actuator assembled with a valve structure according to an embodiment of the present disclosure.

Please refer to FIG. 5. In the embodiment, the miniature fluid actuator 100 further includes a first valve structure 5a and a second valve structure 5b. The first valve structure 5a is fixed to the second surface 13 of the substrate 1 through a first dry film 61. The second valve structure 5b is fixed on the fixed region 31 of the carrier layer 3 through a second dry film 62. The first valve structure 5a includes a first valve seat 51a and a first valve plate 52a. The second valve structure 5b includes a second valve seat 51b and a second valve plate 52b. Preferably but not exclusively, the first valve seat 51a includes at least one first valve hole 511a, and the second valve seat 51b includes at least one second valve hole 511b. The first valve hole 511a of the first valve structure 5a spatially corresponds to the inlet 11 of the substrate 1, and the second valve hole 511b of the second valve structure 5b is in communication with the second chamber 23. The first valve plate 52a and the second valve plate 52b are disposed on the first valve seat 51a and the second valve seat 51b, respectively. Moreover, the first valve plate 52a has a first valve plate body 521a and at least one first valve through hole 522a. The second valve plate 52b has a second valve plate body 521b and at least one second valve through hole 522b. The first valve plate body 521a and the second valve plate body 521b are disposed to cover the first valve hole 511a and the second valve hole 511b, respectively. The first valve through hole 522a and the second valve through hole 522b are disposed around the periphery of the first valve plate body 521a and the periphery of the second valve plate body 521b, respectively. In that, the first valve through hole 522a and the second valve through hole 522b are closed by the first valve seat 51a and the second valve seat 51b, respectively.

Preferably but not exclusively, the above-mentioned first valve seat 51a and the second valve seat 51b are made by a silicon substrate, a stainless steel materials or a glass material, respectively. Preferably but not exclusively, the first valve plate 52a and the second valve plate 52b is made by a polyimide (PI) film.

Figure 6A:
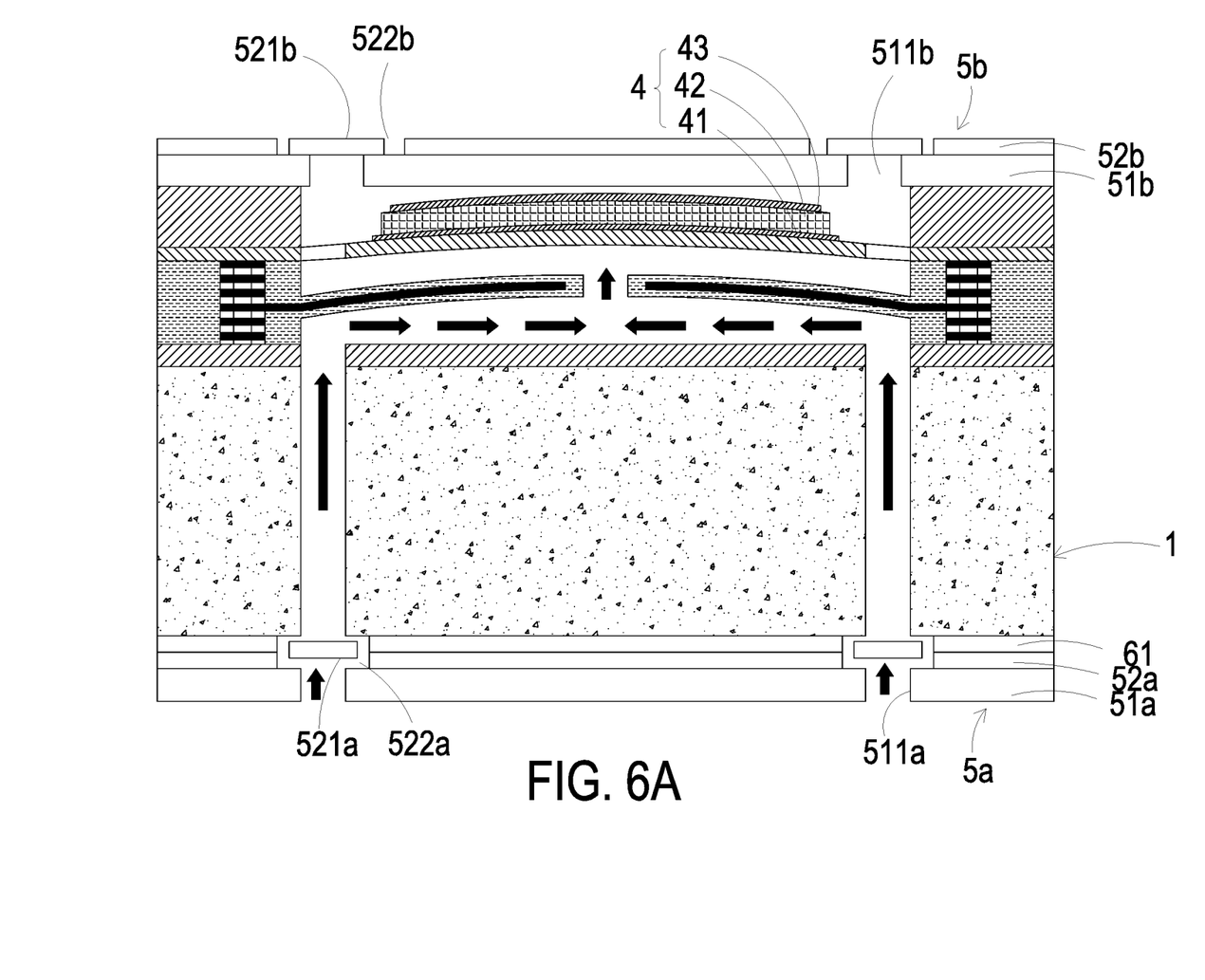
FIGS. 6A to 6B are cross sectional views illustrating actions of the miniature fluid actuator of the present disclosure.
Figure 6B:
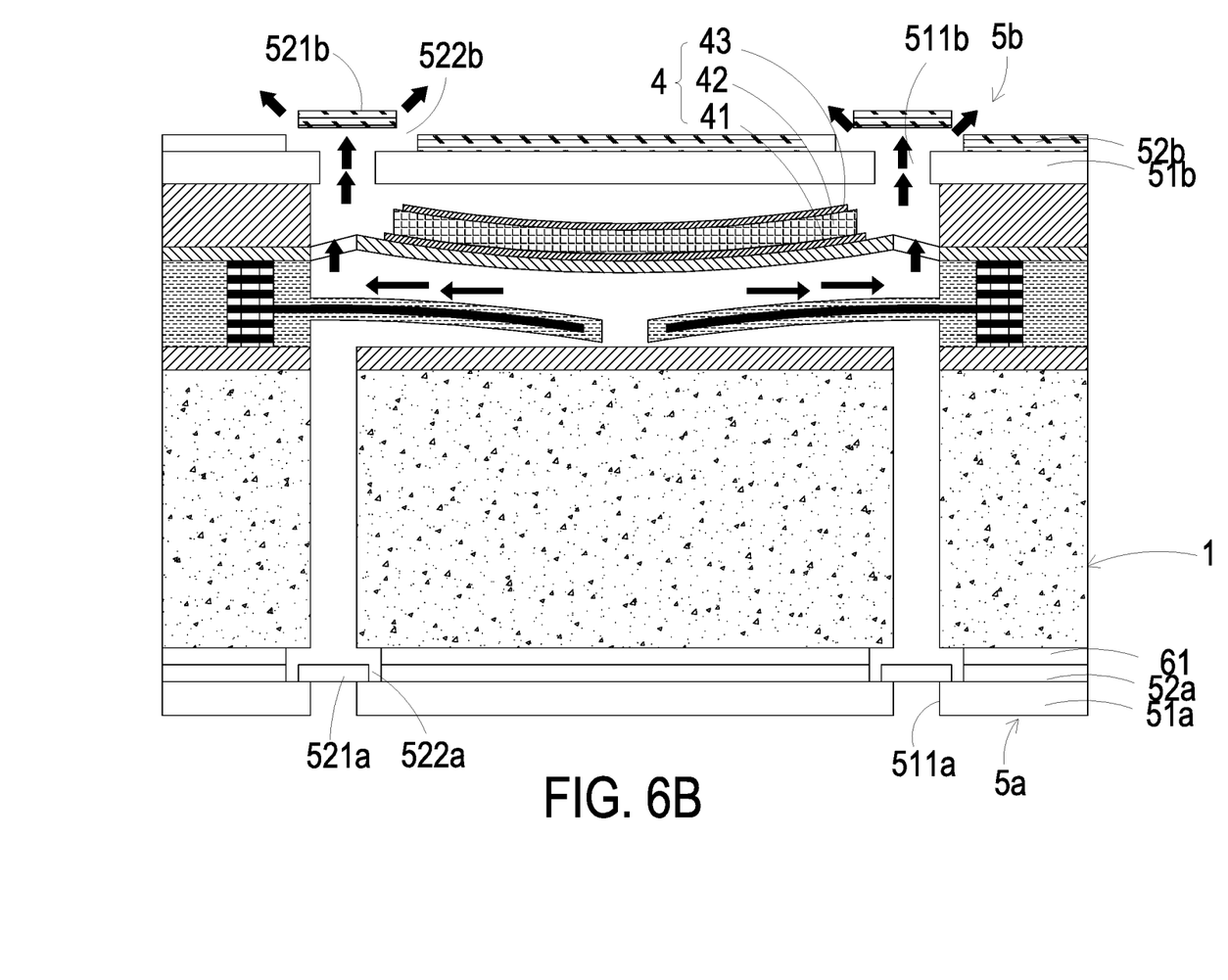

FIGS. 6A to 6B are cross sectional views illustrating actions of the miniature fluid actuator of the present disclosure. Please refer to FIG. 6A. When the upper electrode layer 43 and the lower electrode layer 41 receive a driving voltage and the driving voltage is transmitted to the piezoelectric actuation layer 42, the piezoelectric actuation layer 42 is deformed due to the piezoelectric effect, so that the piezoelectric actuation layer 42 drives the vibration region 32 to displace upwardly and downwardly. When the piezoelectric actuation layer 42 drives the vibration region 32 to move upwardly, the resonance layer 22 is driven to move upwardly. At the same time, the volume of the first chamber 21 is increased and the pressure of the first chamber 21 is decreased into a negative pressure state. Thus, fluid is inhaled from the exterior into the miniature fluid actuator 100 through the inlet 11. When the fluid is inhaled through the inlet 11, since the pressure of the inlet 11 is lower than the pressure outside the miniature fluid actuator 100, the first valve plate body 521a of the first valve structure 5a is pushed upwardly. In that, the first valve plate body 521a is moved away from the corresponding first valve hole 511a, and the fluid is introduced through the first valve hole 511a, and flows into the inlet 11 through the first valve through hole 522a.

Please refer to FIG. 6B. When the piezoelectric actuation layer 42 drives the vibration region 32 to move downwardly, the resonance layer 22 is driven to move downwardly. At the same time, the fluid contained in the second chamber 23 is compressed to move toward the vacant 34. Moreover, the second valve plate body 521b of the second valve structure 5b is pushed upwardly to open the second valve hole 511b of the second valve structure 5b. In that, the fluid flows through the second valve hole 511b and the second valve through hole 522b of the second valve structure 5b and is transported to the exterior. By repeating the above-mentioned steps continuously, the piezoelectric actuation layer 42 is driven to move the vibration layer 32 upwardly and downwardly, and the pressures in the first chamber 21 and the second chamber 23 are changed, to achieve the fluid transportation.

In summary, the present disclosure provides a miniature fluid actuator. It is produced by a semiconductor process and supplemented by a one-poly-six-metal (1P6M) process or a two-poly-four-metal (2P4M) process. It is helpful of eliminating the position misalignment and the depth error of the first chamber and the second chamber during producing. There is no need of performing a combination process, such as the lamination. It avoids to reduce the efficiency due to the depth error of the first chamber and the second chamber. It is extremely valuable for the use of the industry, and it is submitted in accordance with the law.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A miniature fluid actuator comprising:
   a substrate having at least one inlet;
   a chamber layer formed on the substrate and comprising:
      a first chamber connected to the at least one inlet;
      a resonance layer having a central aperture, wherein the central aperture is in communication with the first chamber; and
      a second chamber spatially corresponding to the first chamber and in communication with the first chamber through the central aperture;
   a carrying layer formed on the chamber layer and comprising:
      a fixed region formed on the chamber layer;
      a vibration region located at a center of the fixed region and spatially corresponding to the second chamber;
      at least one connection portion connected between the fixed region and the vibration region; and
      at least one vacant formed among the fixed region, the vibration region and the at least one connection portion; and
   a piezoelectric assembly formed on the vibration region;
   wherein the second chamber is arranged between the carrying layer and the resonance layer.

2. The miniature fluid actuator according to claim 1, wherein the chamber layer comprises a protective layer and a plurality of metal layers.

3. The miniature fluid actuator according to claim 2, wherein the resonance layer is formed by the protective layer.

4. The miniature fluid actuator according to claim 2, wherein the resonance layer is formed by the protective layer and one of the plurality of metal layers.

5. The miniature fluid actuator according to claim 2, wherein the chamber layer comprises an insulation layer and a polysilicon layer, wherein the insulation layer is formed on the substrate, the polysilicon layer is formed on the insulation layer, and the protective layer and the plurality of metal layers are formed on the polysilicon layer.

6. The miniature fluid actuator according to claim 5, wherein the resonance layer is formed by the polysilicon layer.

7. The miniature fluid actuator according to claim 5, wherein the resonance layer is formed by the protective layer.

8. The miniature fluid actuator according to claim 5, wherein the resonance layer is formed by the protective layer and one of the plurality of metal layers.

9. The miniature fluid actuator according to claim 1, wherein the chamber layer comprises an insulation layer, a first polysilicon layer, a first protective layer, a second polysilicon layer, a second protective layer, and a plurality of metal layers, wherein the insulation layer is formed on the substrate, the first polysilicon layer is formed on the insulation layer, the first protective layer is formed on the first polysilicon layer, and the second polysilicon layer is formed on the first protective layer, and the second protective layer and the plurality of metal layers are formed on the second polysilicon layer, wherein the resonance layer is formed by the first polysilicon layer, the first protective layer and the second polysilicon layer.

10. The miniature fluid actuator according to claim 1, wherein the piezoelectric assembly comprises:
   a lower electrode layer;
   a piezoelectric actuation layer stacked on the lower electrode layer; and
   an upper electrode layer stacked on the piezoelectric actuation layer and electrically connected with the piezoelectric actuation layer.

11. The miniature fluid actuator according to claim 1, further comprising a first valve structure, wherein the first valve structure is fixed on the substrate through a first dry film.

12. The miniature fluid actuator according to claim 1, further comprising a second valve structure, wherein the second valve structure is fixed on the fixed region through a second dry film.

* * * * *